United States Patent
Yamagata et al.

(10) Patent No.: US 6,737,344 B2
(45) Date of Patent: May 18, 2004

(54) METHOD FOR MANUFACTURING NONVOLATILE SEMICONDUCTOR MEMORY WITH NARROW VARIATION IN THRESHOLD VOLTAGES OF MEMORY CELLS

(75) Inventors: Satoru Yamagata, Fukuyama (JP); Masanori Yoshimi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/993,890

(22) Filed: Nov. 27, 2001

(65) Prior Publication Data

US 2002/0094638 A1 Jul. 18, 2002

(30) Foreign Application Priority Data

Nov. 28, 2000 (JP) ......................................... 2000-361152

(51) Int. Cl.[7] ............................................ H01L 21/3205
(52) U.S. Cl. ...................................... 438/594; 254/321
(58) Field of Search ................................ 438/257, 211, 438/218, 290, 296, 337, 404, 593–596, 221, 445, 756; 257/321–333, 314–316

(56) References Cited

U.S. PATENT DOCUMENTS

| 5,445,984 A | * | 8/1995 | Hong et al. ................. 437/43 |
| 5,482,881 A | * | 1/1996 | Chen et al. ................. 437/43 |
| 6,143,607 A | * | 11/2000 | Chi ............................ 438/257 |

FOREIGN PATENT DOCUMENTS

JP          9-17890 A       1/1997

* cited by examiner

Primary Examiner—Caridad Everhart
Assistant Examiner—Lee Calvin
(74) Attorney, Agent, or Firm—Nixon & Vanderhye P.C.

(57) ABSTRACT

In a method for manufacturing a memory cell of a nonvolatile semiconductor memory, a floating gate, first insulating film and control gate are successively stacked on a tunnel oxide film formed on a substrate of the nonvolatile semiconductor memory. The control gate, the first insulating film and the floating gate are patterned in stripes. Subsequently, a damaged portion of the tunnel oxide film immediately below a sidewall of the floating gate is removed by isotropic etching. A second insulating film is deposited to cover the control gate, sidewalls of the first insulating film, the floating gate and the tunnel oxide film. Thereby, a variation in threshold voltages between memory cells is suppressed.

8 Claims, 10 Drawing Sheets

METHOD FOR MANUFACTURING NONVOLATILE SEMICONDUCTOR MEMORY WITH NARROW VARIATION IN THRESHOLD VOLTAGES OF MEMORY CELLS

BACKGROUND OF THE INVENTION

The present invention relates to a method for manufacturing a nonvolatile semiconductor memory. More specifically, the present invention relates to a method for manufacturing a nonvolatile semiconductor memory having a tunnel oxide film, floating gate, insulating film and control gate stacked in this order on a semiconductor substrate.

Conventionally, a nonvolatile semiconductor memory of this kind is manufactured according to a process order shown in FIGS. 10A to 10C and 11A to 11C. FIGS. 10A to 10C are cross sections in an X—X direction in FIG. 1A. FIGS. 11A to 11C are cross sections in a Y—Y direction in FIG. 1A. Here, FIG. 1A is a plan view of a nonvolatile semiconductor memory according to an embodiment of the present invention, but FIG. 1A is also used to explain a conventional technique.

First, as shown in FIGS. 10A and 11A, a tunnel oxide film 2 having a thickness of 10 nm is formed on a semiconductor substrate 1 by thermal oxidation. Then, a first conductive layer 3 having a thickness of 100 nm is deposited. The first conductive layer 3 is composed of polysilicon as a material of a floating gate. Subsequently, the tunnel oxide film 2 and the first conductive layer 3 are patterned in stripes extending in the Y—Y direction. At this time, a size of the first conductive layer 3 in the X—X direction (channel direction) is set so as to match a size of the floating gate to be finally formed.

Subsequently, phosphorus (P) ion implantation is performed under conditions of an acceleration energy of 50 keV and a dose of $3.0 \times 10^{13}$ ions/cm$^2$ by using the first conductive layer 3 patterned in stripes as a mask so as to form an n-type low-concentration impurity diffusion layer 4 in a surface region of the semiconductor substrate 1 between the first conductive layers 3.

Subsequently, photolithography is performed to form a photoresist (not shown) in stripes extending in the Y—Y direction. Arsenic (As) ion implantation is performed by using this photoresist and the first conductive layer 3 patterned in stripes as masks under conditions of an acceleration energy 15 keV and a dose of $4.5 \times 10^{15}$ ions/cm$^2$ so as to form an n-type high-concentration impurity diffusion layer 5 in the low-concentration impurity diffusion layer 4. These impurity diffusion layers 4, 5 are used as a source/drain region i.e. a bit line.

Subsequently, as shown in FIG. 10B, an interlayer insulating film 6 is deposited on these layers in a thickness exceeding the thickness of the first conductive layer 3 by the CVD method to sufficiently cover the first conductive layer 3. Subsequently, an etchback is performed to planarize the surface of the interlayer insulating film 6, and the interlayer insulating film 6 is so left as to be embedded between the first conductive layers 3.

Subsequently, as shown in FIGS. 10C and 11C, a first insulating film 7 composed of, for example, an ONO film (oxide film/nitride film/oxide film) is deposited and then a second conductive layer 8 composed of polysilicon having a thickness of 200 nm is deposited. Then, photolithography is performed to form a photoresist (not shown) in stripes extending in the X—X direction. The second conductive layer 8, the first insulating film 7 and the first conductive layer 3 are etched and patterned by using this photoresist as a mask. Consequently, there are formed a control gate in stripes composed of the second conductive layer 8, the first insulating film 7 in stripes composed of the ONO film and a floating gate in a rectangular solid composed of the first conductive layer 3.

In this state, as shown in FIG. 12A which is an enlarged view of a portion P enclosed with a broken line in FIG. 11C, a portion of the tunnel oxide film 2 immediately below a sidewall of the floating gate 3 includes damages (shown with x). This damaged portion easily serves as a path for electrons to leak from the floating gate 3 to the semiconductor substrate 1 side during an operation of a finished product. Accordingly, as shown in FIG. 12B, thermal oxidation is performed, for example, in an oxygen atmosphere at 850° C. for 20 minutes so as to form a silicon oxide film 11 having a thickness of 20 to 30 nm on the sidewalls of the floating gate 3 composed of polysilicon and the control gate 8.

Subsequently, as shown in FIG. 11C, boron (B) ion implantation is performed under conditions of an acceleration energy 40 keV and a dose of $1.0 \times 10^{13}$ ions/cm$^2$ by using the control gate 8 as a mask so as to form a p-type element separating impurity diffusion layer 9 in a surface region of the semiconductor substrate 1 between the control gates 8.

Then, an interlayer insulating film is deposited on this layer by a known method, a contact hole is opened in this interlayer insulating film and then interconnect lines are further formed to complete a nonvolatile memory, none of which are shown.

However, in the above conventional manufacturing method, as shown in FIG. 7 which is an enlarged view of a portion P1 enclosed with a broken line in FIG. 12A, a grain boundary 13 between polysilicon grains 12 of the floating gate 3 is easily oxidized during the process of oxidizing the sidewalls of the floating gate 3 and the control gate 8 because the silicon oxide film 11 is formed on the sidewalls of the floating gate 3 and the control gate 8, resulting in localized nonuniform oxidation. As a result, a localized electric field concentration occurs between the floating gate 3 and the source/drain region in the semiconductor substrate 1 during an operation of the nonvolatile memory. Thus, a problem arises that equal FN (Fowler-Nordheim) currents do not flow through the tunnel oxide film in each memory cell during a write operation, thereby increasing a variation in threshold voltages between the memory cells.

As known, usually, data is simultaneously written in memory cells on the same word line (control gate). As evident from FIG. 9 showing a threshold voltage distribution after a write operation in memory cells on the same word line, there is a large variation of 2.2 V in threshold voltages among nonvolatile memory cells on the same word line, which cells are manufactured by the above method.

In order to even the threshold voltages during a write operation, a verify write operation for each bit is usually performed. However, when there is a large variation in threshold voltages among memory cells on the same word line as described above, the number of steps during the write operation needs to be increased, resulting in a longer write time.

Furthermore, when data is written in this semiconductor memory, a high voltage is also applied to a nonselected memory cell on the same word line. Therefore, electrons in a floating gate of the nonselected cell are decreased (gate disturbance). When the variation in threshold voltages is large among memory cells on the same word line, a memory cell in which data can be particularly rapidly written is easily affected by the gate disturbance.

To solve the above problem, as shown in FIG. 13, a technique has been proposed wherein a tunnel oxide film 24, a floating gate electrode 25 and a source region 22 are formed on the semiconductor substrate 21, thereafter a material of the floating gate electrode 25 is isotropically etched and then oxidized (Japanese Patent Laid-Open Publication H9-17890). With this technique, a corner portion of the floating gate 25 on the semiconductor substrate 21 is made round while an oxide film 28 is formed. However, this technique cannot control the localized nonuniform oxidation attributable to polysilicon grains constituting the floating gate electrode 25. As a result, an electric field concentration cannot be prevented and a variation in FN currents occurs for each memory cell and the variation in threshold voltages between memory cells is increased. Furthermore, since controlling of an etching rate in the isotropic etching process is difficult, a large margin is required, thereby hindering future miniaturization. Furthermore, the size of the floating gate changes depending on the etching rate in the isotropic etching process and the channel length and the channel width change, which also causes a variation in threshold voltage.

SUMMARY OF THE INVENTION

Accordingly, an object of the present invention is to provide a method for manufacturing a nonvolatile semiconductor memory by which various problems such as gate disturbance can be solved by suppressing variations in threshold voltages of the nonvolatile semiconductor.

To achieve the above object, the present invention provides a method for manufacturing a nonvolatile semiconductor memory wherein memory cells each having a tunnel oxide film, a floating gate, a first insulating film and a control gate stacked in this order are formed in a matrix on a semiconductor substrate, the method comprising the steps of:

forming the tunnel oxide film on the semiconductor substrate;

forming a first conductive layer to be used as a material of the floating gate on the tunnel oxide film;

patterning the first conductive layer in stripes extending in one direction;

forming a source/drain region in a surface of the semiconductor substrate by using the first conductive layer as a mask;

forming the first insulating film on the first conductive layer;

forming a second conductive layer on the first insulating film;

forming the control gate in stripes composed of the second conductive layer, the first insulating film in stripes and the floating gate in a rectangular solid composed of the first conductive layer by etching with a mask in stripes extending a direction perpendicular to the first conductive layer;

removing a portion of the tunnel oxide film immediately below a sidewall of the floating gate by isotropical etching; and depositing a second insulating film on the control gate, sidewalls of the first insulating film, the floating gate and the tunnel oxide film to be covered with the second insulating film.

According to the present invention, a portion of the tunnel oxide film immediately below the sidewall of the floating gate is removed by isotropic etching. This removes a damaged layer generated in the tunnel oxide film during the process of forming the floating gate. Therefore, there would be no path for electrons to leak from the floating gate to the semiconductor substrate side during an operation of a finished product. Furthermore, when the second insulating film is deposited and then thermal oxidation is performed to oxidize the sidewall of the floating gate via the second insulating film, uniform oxidation occurs at an interface between the floating gate and the surrounding insulating film. Therefore; equal FN (Fowler-Nordheim) currents flow through the tunnel oxide film in each memory cell during a write operation. Thus, compared with a conventional memory, the variation in threshold voltages among memory cells, for example, memory cells on the same word line is reduced.

As a result, since there is no variation in threshold voltages on the same word line, the number of steps during the write operation can be reduced, thereby shortening the write time.

In addition, since memory cells on the same word line wherein data is written particularly rapidly can be erased, the number of memory cells affected by gate disturbance can be reduced.

Furthermore, since the second insulating film is formed in a space portion of the floating gate, miniaturization is not hindered.

Still furthermore, the size of the floating gate does not change depending on isotropic etching of the tunnel oxide film after formation of the floating gate or deposition of the second insulating film. Therefore, there is no problem of a short channel effect due to the channel length or a narrow channel effect due to the channel width and no variation in threshold voltages attributable to them occurs.

In one embodiment of the present invention, after the second insulating film is deposited, thermal oxidation is performed to oxidize the sidewall of the floating gate via the second insulating film.

According to the embodiment, uniform oxidation occurs at an interface between the floating gate and the surrounding insulating film. Therefore, equal FN (Fowler-Nordheim) currents flow through the tunnel oxide film in each memory cell during a write operation. Thus, compared with a conventional memory, the variation in threshold voltages between memory cells, for example, memory cells on the same word line is reduced.

In one embodiment of the present invention, isotropic etching of the tunnel oxide film after formation of the floating gate is performed by wet etching using a fluorinated acid.

According to the embodiment, a portion of the tunnel oxide film immediately below a sidewall of the floating gate can be precisely removed by wet etching using the fluorinated acid.

In one embodiment of the present invention, the second insulating film is a silicon oxide film formed by chemical vapor deposition According to the embodiment, the sidewalls of the control gate, the first insulating film, the floating gate and the tunnel oxide film can be favorably covered with the second insulating film.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereafter, a method for manufacturing a nonvolatile semiconductor memory of the present invention is explained in detail with reference to an embodiment.

Figure 1A:
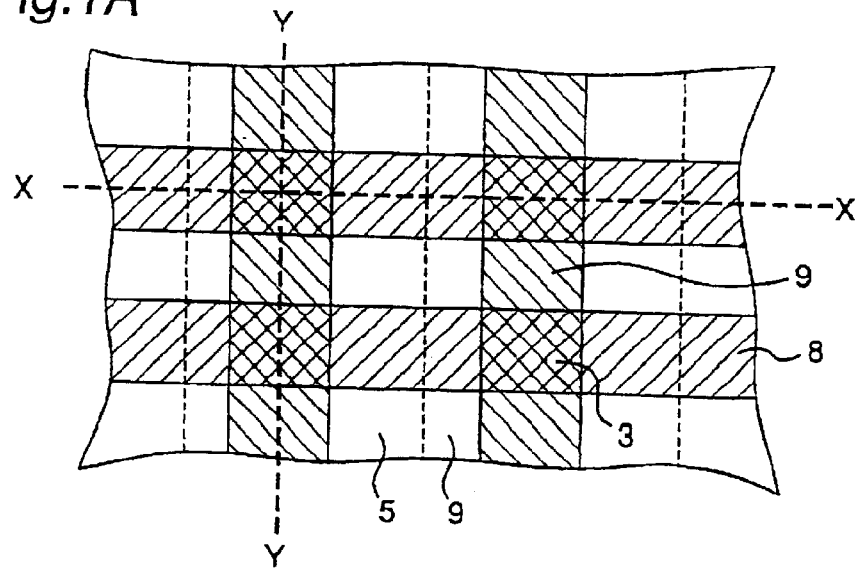
FIG. 1A is a plane layout showing a virtual ground type nonvolatile semiconductor memory array to be manufactured.
Figure 1B:
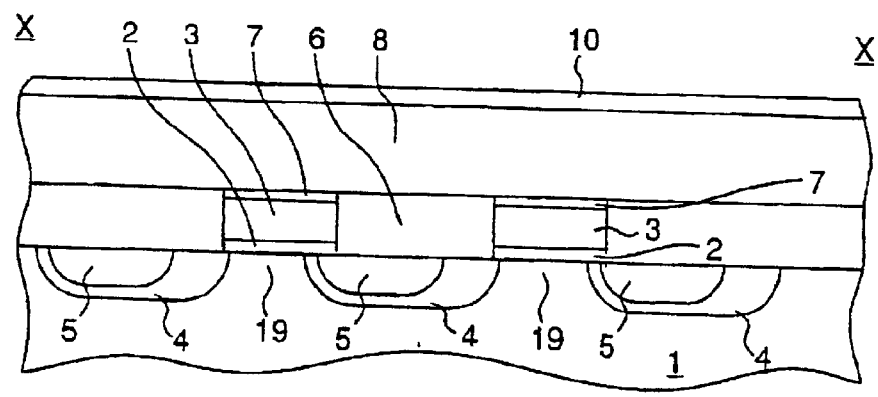
FIG. 1B is a cross sectional view taken along line X—X in FIG. 1A
Figure 1C:
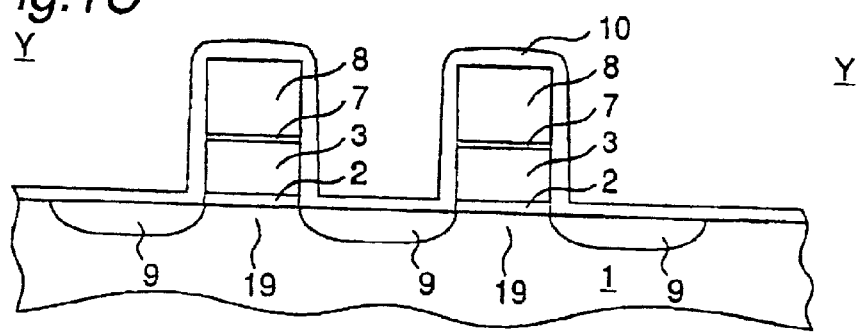
FIG. 1C is a cross sectional view taken along line Y—Y in FIG. 1A.

FIG. 1A is a plane layout showing a nonvolatile semiconductor memory array to be manufactured. FIG. 1B is a cross section taken along line X—X in FIG. 1A. FIG. 1C is a cross section taken along line Y—Y in FIG. 1A. To make the explanation easy, the same component members as in FIGS. 10A through 12B are designated by the same reference numerals in this embodiment.

This nonvolatile semiconductor memory array further has a high-concentration impurity diffusion layer 5 in a low-concentration impurity diffusion layer 4 formed in a surface or a semiconductor substrate 1. These impurity diffusion layers 4, 5 constitute a source/drain region i.e. a bit line. A tunnel oxide film 2, a floating gate 3, a first insulating film 7 and a control gate 8 are successively stacked on a channel region 19 between the source/drain regions 4, 5. Reference numeral 9 denotes an element separating impurity diffusion layer. Reference numeral 10 denotes a second insulating film.

In this embodiment, there is explained a memory cell array of a type wherein source interconnect lines and drain interconnect lines are not fixed and the source interconnect lines (ground interconnect lines) and the drain interconnect lines are appropriately switched (hereinafter, referred to as "virtual ground type").

Figure 3A:
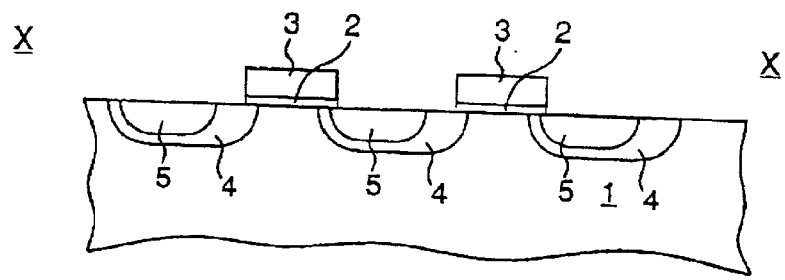
FIGS. 3A to 3C are cross sectional views showing processes of a method for manufacturing a nonvolatile semiconductor memory according to one embodiment of the invention.
Figure 3B:
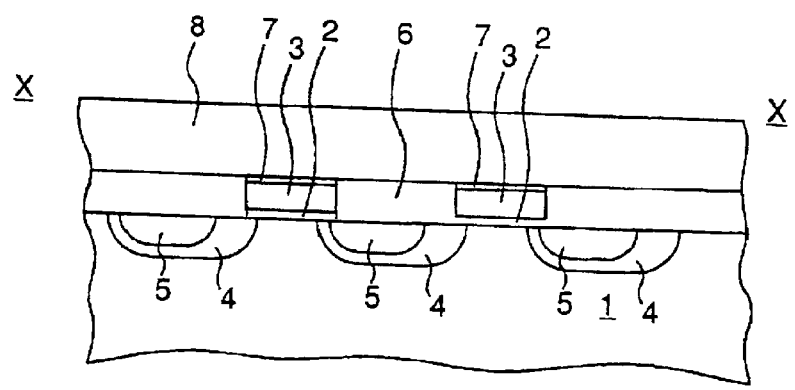
Figure 3C:
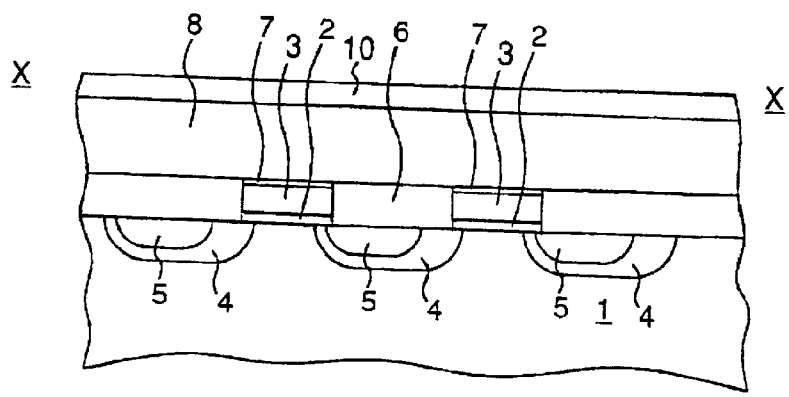
Figure 4A:
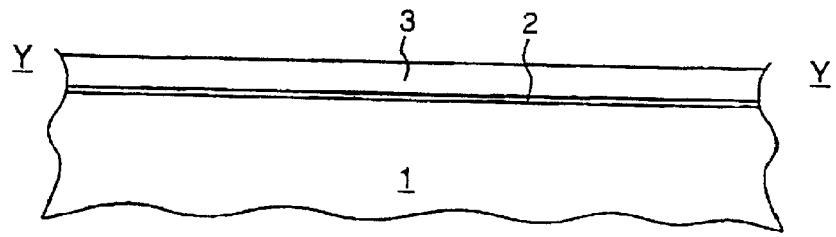
FIGS. 4A to 4C are cross sectional views showing processes of the method for manufacturing a nonvolatile semiconductor memory according to the embodiment of the invention.
Figure 4B:
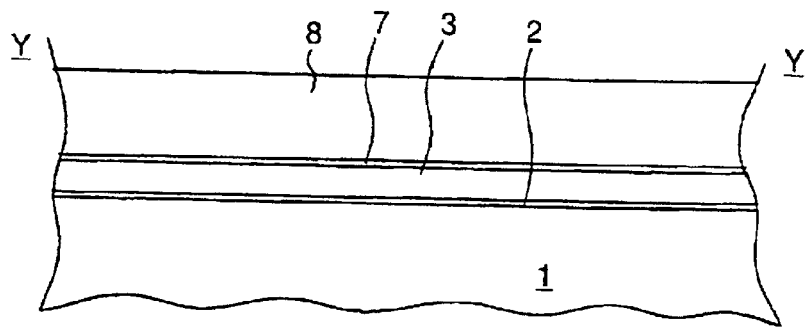
Figure 4C:
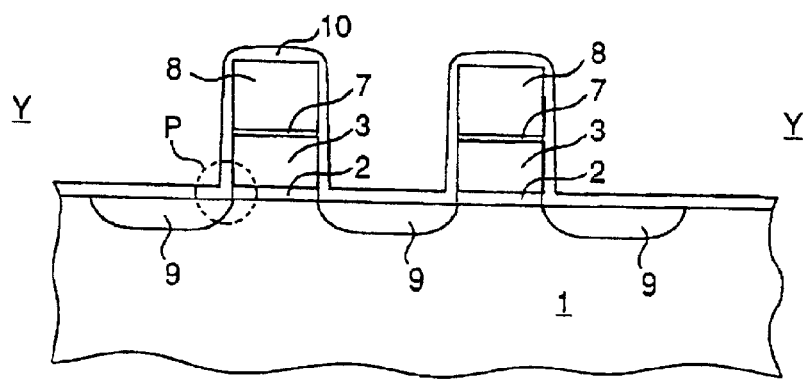

This nonvolatile semiconductor memory array is manufactured according to a process order shown in FIGS. 3A to 3C and 4A to 4C. FIGS. 3A to 3C show cross sections of the nonvolatile semiconductor memory array in an X—X direction in course of manufacture. FIGS. 4A to 4C show cross sections thereof in a Y—Y direction.

First, as shown in FIG. 4A, a tunnel oxide film 2 having a thickness of 10 nm is formed on a semiconductor substrate 1 composed of single crystal silicon by thermal oxidation. Then, a first conductive layer 3 having a thickness of 100 nm is deposited. The first conductive layer 3 is composed of polysilicon as a material of a floating gate. Subsequently, as shown in FIG. 3A, the tunnel oxide film 2 and the first conductive layer 3 are patterned in stripes extending in the Y—Y direction. At this time, the size of the first conductive layer 3 in the X—X direction (channel direction) is set so as to match a size of the floating gate to be finally formed.

Subsequently, phosphorus (P) ion implantation is performed under conditions of an acceleration energy of 50 keV and a dose of $3.0 \times 10^{13}$ ions/cm$^2$ by using the first conductive layer 3 patterned in stripes as a mask so as to form an n-type low-concentration impurity diffusion layer 4 in a region between the first conductive layers 3 in the surface of the semiconductor substrate 1.

Subsequently, photolithography is performed to form a photoresist (not shown) in stripes extending in the Y—Y direction. Arsenic (As) ion implantation is performed by using this photoresist and the first conductive layer 3 patterned in stripes as masks under conditions of an acceleration energy 15 keV and a dose of $4.5 \times 10^{15}$ ions/cm$^2$ so as to form an n-type high-concentration impurity diffusion layer 5 in the low-concentration impurity diffusion layer 4. These impurity diffusion layers 4, 5 are used as a source/drain region i.e. a bit line.

Subsequently, as shown in FIG. 3B, an interlayer insulating film 6 is deposited on these layers in a thickness exceeding the thickness of the first conductive layer 3 by the CVD method to sufficiently cover the first conductive layer 3. Subsequently, an etchback was performed to planarize the surface of the interlayer insulating film 6 while the interlayer insulating film 6 is so left as to be embedded between the first conductive layers 3.

Subsequently, as shown in FIGS. 3C and 4C, a first insulating film 7 composed of e.g. an ONO film (oxide film/nitride film/oxide film) is deposited and then a second conductive layer 8 composed of polysilicon having a thickness of 200 nm is deposited Then, photolithography is performed to form a photoresist (not shown) in stripes extending in the X—X direction. The second conductive layer 8, the first insulating film 7 and the first conductive layer 3 are etched and patterned by using this photoresist as a mask. Consequently, there are formed a control gate 8 in stripes composed of the second conductive layer, the first insulating film 7 in stripes composed of the ONO film and a floating gate 3 in a rectangular solid composed of the first conductive layer.

Figure 5A:
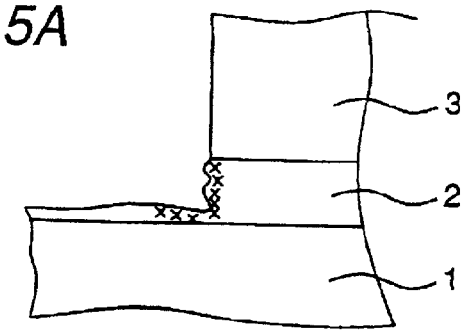
FIGS. 5A to 5D are cross sectional views showing processes of the method for manufacturing a nonvolatile semiconductor memory according to the embodiment of the invention.
Figure 5B:
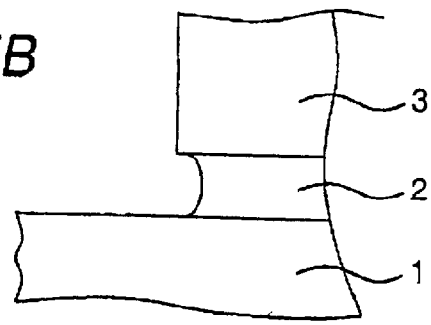

In this state, as shown in FIG. 5A which is an enlarged view of a portion P enclosed with a broken line in FIG. 4C, damages appears at a portion (shown with x) of the tunnel oxide film 2 immediately below a sidewall of the floating gate 3. This damaged layer easily serves as a path for electrons to leak from the floating gate 3 to the semiconductor substrate 1 side during operation of a finished product. Accordingly, as shown in FIG. 5B, in order to remove the damaged portion of the tunnel oxide film immediately below the sidewall of the floating gate 3, isotropic etching is performed. In this example, wet etching is performed with use of fluorinated acid as an etchant so as to precisely remove the damaged portion.

Figure 5C:
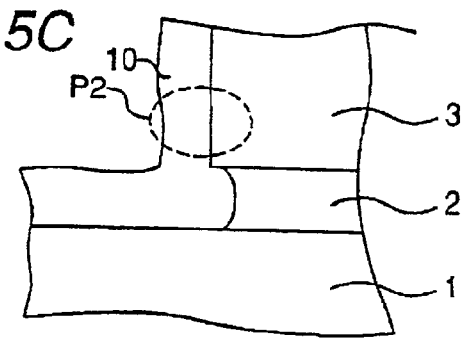

Subsequently, as shown in FIG. 5C as well as FIGS. 3C and 4C, a silicon oxide film having a thickness of 10 to 15 nm is deposited as a second insulating film 10 on the semiconductor substrate 1 by Chemical Vapor Deposition (CVD). The silicon oxide film may be composed of an HTO (High Temperature chemical vapor deposition Oxide) film, for example. Consequently, sidewalls of the control gate 8, the first insulating film 7, the floating gate 3 and the tunnel oxide film 2 are covered with the second insulating film 10. Since this second insulating film 10 is deposited by CVD, the sidewalls of the control gate 8, the first insulating film 7, the floating gate 3 and the tunnel oxide film 2 can be favorably covered.

Figure 5D:
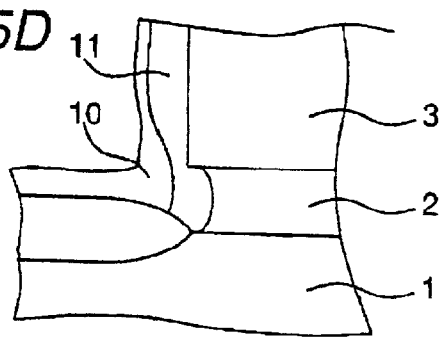
Figure 6:
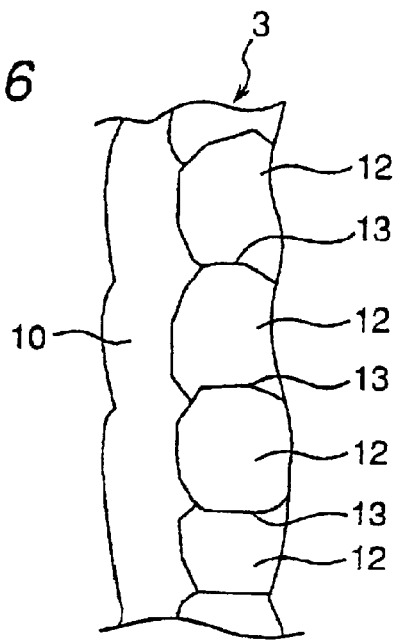
FIG. 6 is a view for explaining actions in the method for manufacturing a nonvolatile semiconductor memory according to the embodiment of the invention.
Figure 7:
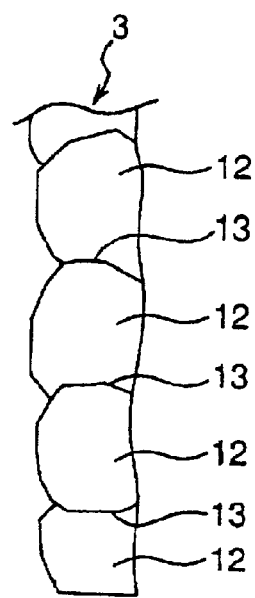
FIG. 7 is a view for explaining a problem in a conventional method for manufacturing a nonvolatile semiconductor memory.

Subsequently, as shown in FIG. 5D, thermal oxidation is performed in an oxygen atmosphere at e.g. 850° C. for 20 minutes so as to oxidize the sidewalls of the floating gate 3 and the control gate 8 composed of polysilicon via the second insulating film 10. Consequently, a silicon oxide film 11 composed of polysilicon having a thickness of 20 to 30 nm is formed on sidewalls of the floating gate 3 and the control gate 8. In this case, as shown in FIG. 6 which is an enlarged view of a portion P2 enclosed with a broken line in FIG. 5C, oxidation of the grain boundary 13 between polysilicon grains 12 constituting the floating gate 3 is suppressed and uniform oxidation occurs at the interface between the floating gate 3 and its surrounding insulating films 10 and 11.

Subsequently, boron (B) ion implantation is performed under conditions of an acceleration energy 40 keV and a dose $1.0 \times 10^{13}$ ions/cm$^2$ by using the control gate 8 as a mask so as to form a p-type element separating impurity diffusion layer 9 in a surface region of the semiconductor substrate 1 between the control gates 8, as shown in FIG. 4C.

Then, an interlayer insulating film is deposited on this layer by a known method, a contact hole is opened in this interlayer insulating film and then interconnect lines are further formed to complete a nonvolatile memory, none of which are shown.

Figure 2:
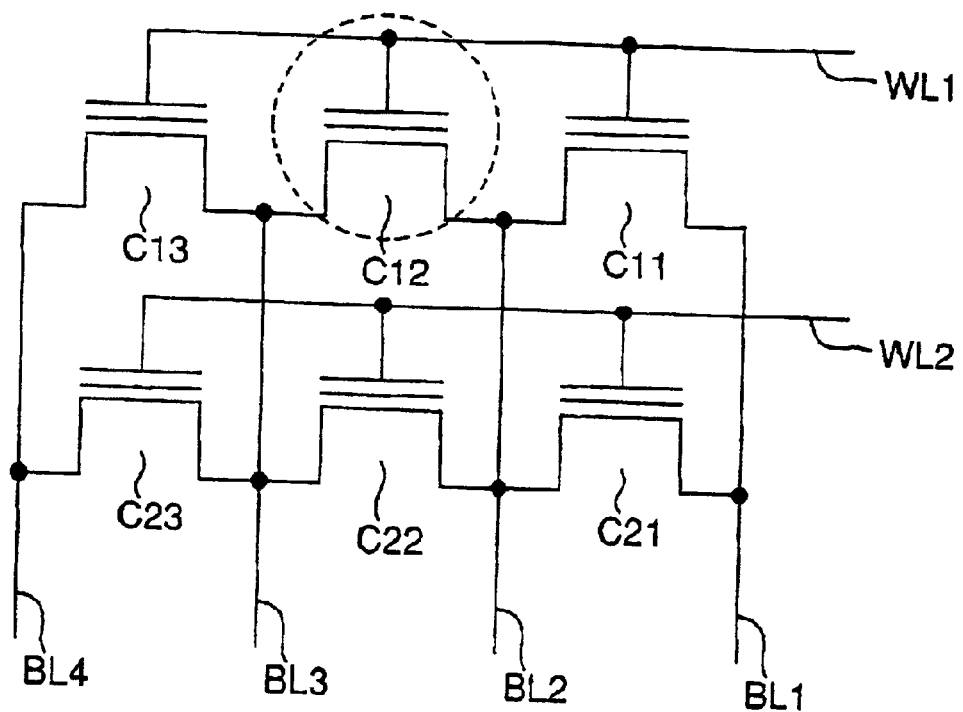
FIG. 2 is an equivalent circuit diagram showing the above nonvolatile semiconductor memory array.

FIG. 2 shows an equivalent circuit of the nonvolatile memory array manufactured as described above.

Table 1 shows operation conditions in operations of write, erase and read of data in the nonvolatile memory array when a memory cell C12 (enclosed with broken line in FIG. 2) is selected. It is noted that the relationship among voltages in Table 1 is that VH1 and VH2 are higher than Vcc, and that Vcc is higher than VL.

TABLE 1

| Operation mode | Word line voltage (V) | | Bit line voltage (V) | | | |
|---|---|---|---|---|---|---|
| | WL1 | WL2 | BL1 | BL2 | BL3 | BL4 |
| Write | -VH1 | 0 | Float | Vcc | Float | Float |
| Erase | VH2 | VH2or0 | 0 | 0 | 0 | 0 |
| Read | Vcc | 0 | VL | VL | VL | VL |

In a write operation, a negative high voltage VH1 (for example, -8 V) is applied to a word line (control gate) WL1 connected to the memory cell C12. A prescribed positive power source voltage Vcc (for example, 4 V) is applied to a bit line BL2 connected to a drain of the memory cell C12. Furthermore, the other bit lines BL1, BL3 and BL4 are in a floating state while the other word line WL2 has 0 V. Under these conditions, in the memory cell C12, tunnel currents flow by an electric field between the floating gate 3 and the drain 5 via the tunnel oxide film 2, so that data is written in the memory cell C12. Meanwhile, when a voltage is applied to the control gate 8 in a nonselected memory cell e.g. a memory cell C11 wherein a source is connected to the bit line BL2, tunneling between the source and the floating gaze does not occur. This is because the source region is formed with an impurity diffusion layer 4 having a low impurity concentration, and thus tunnel currents do not flow and data is not written.

In an erase operation, all the bit lines are set to be 0 V while a positive high voltage VH2 (for example, 12 V) is applied to a desired word line WL1. Consequently, written data in a plurality of memory cells are erased in a batch. For example, when a voltage VH2 is applied to the word line WL1, written data in memory cells C11, C12 and C13 are erased in a batch. When a voltage VH2 is applied to the word line WL2, written data of memory cells C21, C22 and C23 are erased in a batch.

In a read operation for reading the selected cell C12, a prescribed voltage Vcc (for example, 3 V) is applied to the word line WL1 while a prescribed voltage VL (for example, 1 V) and 0 V are applied to the bit line BL2 and the bit line BL3, respectively, to detect currents that flow between the bit lines.

It is noted that only the case where the memory cell C12 is selected is explained above, but data is simultaneously written to selected cells on the same word line.

In the above manufacturing method, as described above, isotropic etching is performed after the formation process of the floating gate 3 so as to remove the damaged portion of the tunnel oxide film 2 immediately below the sidewall of the floating gate 3, which portions are generated during the floating gate 3 formation process. Therefore, there is no path for electrons to leak from the floating gate 3 to the semiconductor substrate 1 side during operation of a finished product. Furthermore, uniform oxidation occurs at the interface between the floating gate 3 and the surrounding insulating films 10, 2 since thermal oxidation is performed after the deposition of the second insulating film 10 to oxidize the sidewall of the floating gate 3 via the second insulating film 10. Therefore, equal FN (Fowler-Nordheim) currents flow through the tunnel oxide film 2 in each memory cell during a write operation. Thus, compared with a conventional memory, a variation in threshold voltages among memory cells, for example, memory cells on the same word line is reduced.

As a result, since threshold voltages do not vary on the same word line, the number of steps during a write operation can be reduced, thereby shortening the write time.

Furthermore, memory cells affected by gate disturbance can be reduced since memory cells on the same word line wherein data is particularly rapidly written can be erased.

Furthermore, miniaturization is not hindered since the second insulating film 10 is formed in a space portion of the floating gate 3.

Furthermore, the size of the floating gate 3 does not change after formation of the floating gate 3 depending on isotropic etching of the tunnel oxide film 2 or deposition of the second insulating film 10. Therefore, there is no problem of a short channel effect due to the channel length or a narrow channel effect due to the channel width and no variation in threshold voltage attributable thereto occurs.

Figure 8:
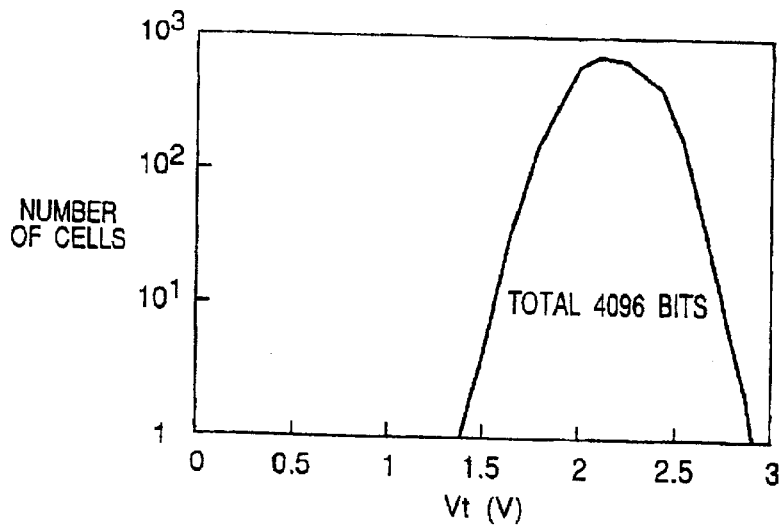
FIG. 8 is a view showing a threshold voltage distribution after write in memory cells on the same word line in a nonvolatile memory array manufactured by the method for manufacturing a nonvolatile semiconductor memory according to one embodiment of the invention.
Figure 9:
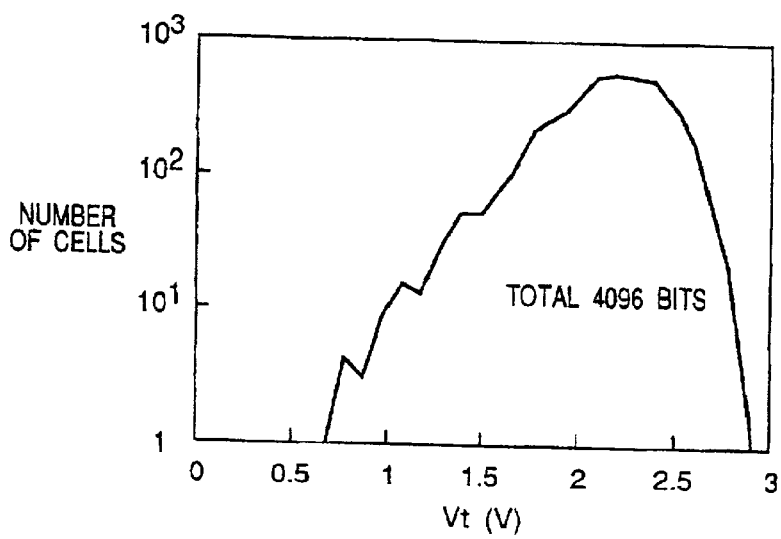
FIG. 9 is a view showing a threshold voltage distribution after write in memory cells on the same word line in a nonvolatile memory array manufactured by a conventional manufacturing method.
Figure 10A:
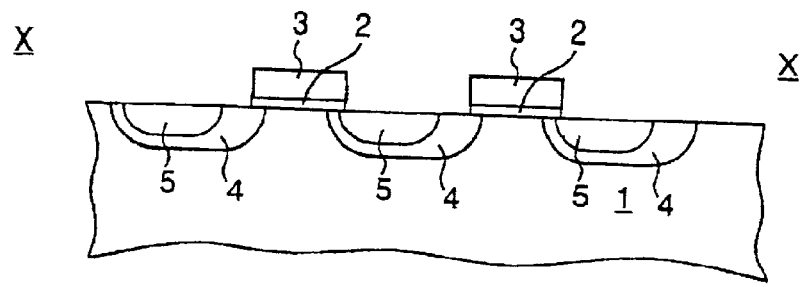
FIGS. 10A to 10C each are a cross sectional view showing a process of a conventional nonvolatile semiconductor memory.
Figure 10B:
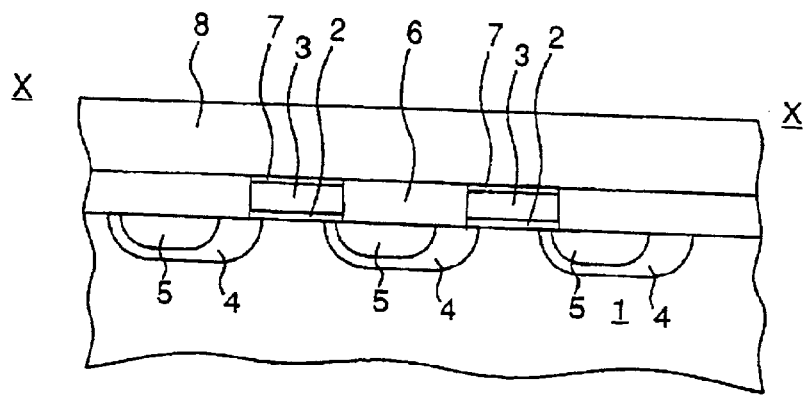
Figure 10C:
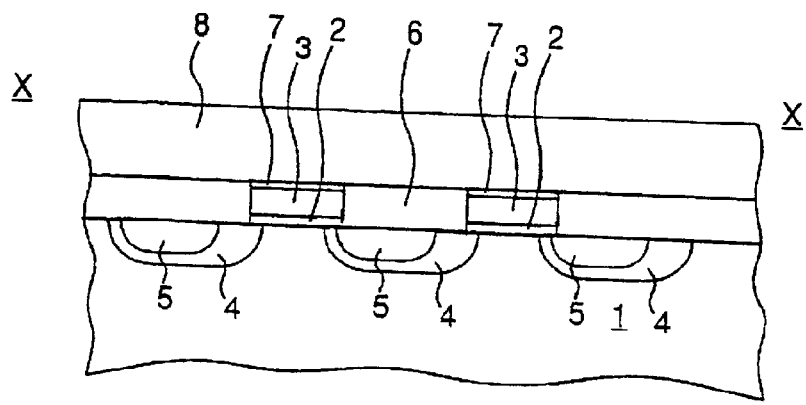
Figure 11A:
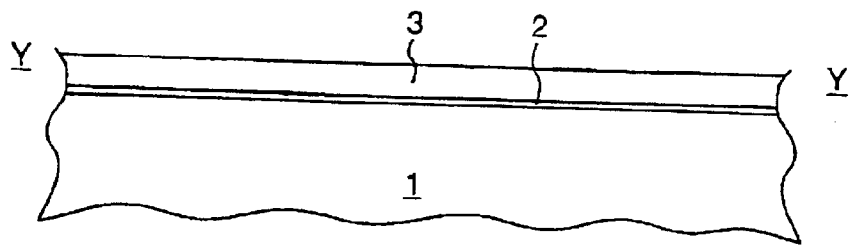
FIGS. 11A to 11C are cross sectional views showing processes of the conventional method for manufacturing a nonvolatile semiconductor memory.
Figure 11B:
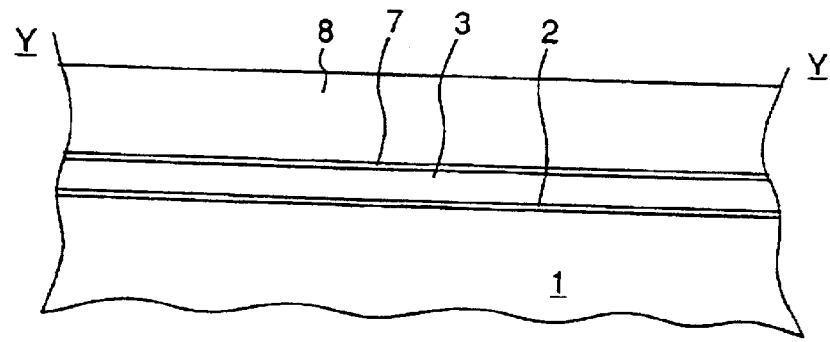
Figure 11C:
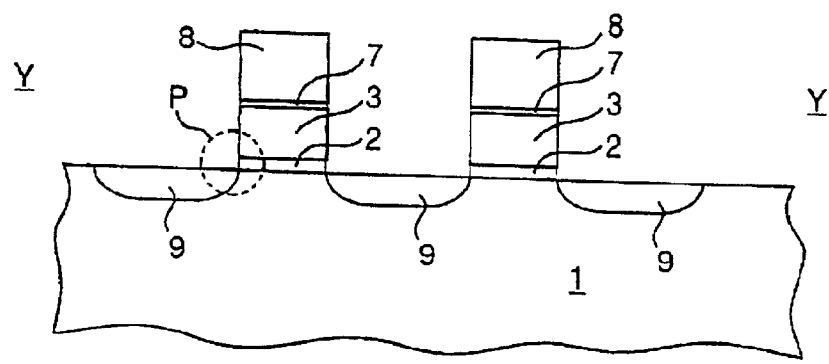
Figure 12A:
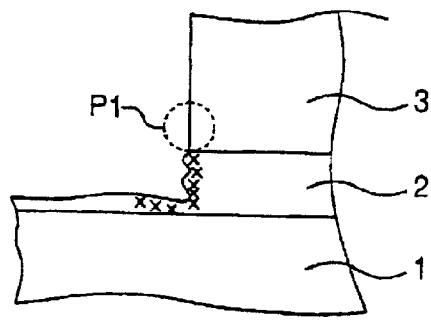
FIGS. 12A and 12B are cross sectional views showing processes of the conventional method for manufacturing a nonvolatile semiconductor memory.
Figure 12B:
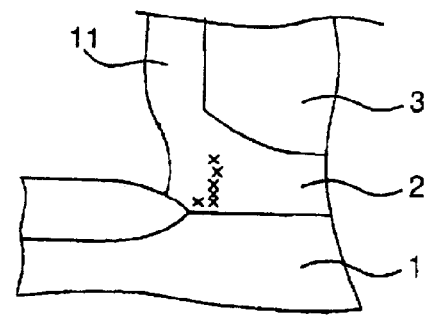
Figure 13:
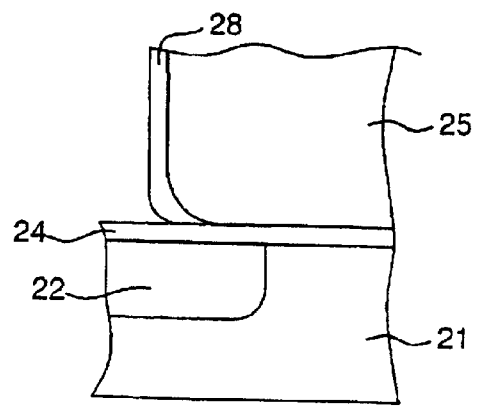
FIG. 13 is a cross sectional view showing a process of another conventional method for manufacturing a nonvolatile semiconductor memory.

FIG. 8 shows a threshold voltage distribution after a write operation in memory cells on the same word line in the nonvolatile memory array manufactured by the above method. As evident in comparison of FIG. 8 with FIG. 9 which shows the threshold voltage distribution in the conventional nonvolatile memory array, variation in threshold voltages among memory cells on the same word line is reduced to 1.6 V in the nonvolatile memory cell manufactured by the method of the present embodiment.

In this embodiment, after the first conductive layer 3 is processed by using a mask in stripes extending in the X—X direction, isotropic etching of the tunnel oxide film 2 and deposition of the second insulating film 10 are performed by applying the present invention. However, the process order is not limited to this. After the first conductive layer 3 is processed by using a mask in stripes extending in the Y—Y direction, isotropic etching of the tunnel oxide film 2 and deposition of the second insulating film 10 may be performed by applying the present invention the present invention. This case can also achieve a similar effect.

Furthermore, in this embodiment, a virtual ground type memory cell array suitable for high integration is manufactured, but the type of the memory cell array is not limited to this type. The present invention is widely applied to other various types of nonvolatile semiconductor memories.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A method for manufacturing a nonvolatile semiconductor memory including memory cells formed in a matrix on a semiconductor substrate, wherein each memory cell comprises a tunnel oxide film, a floating gate, a first insulating film and a control gate stacked in this order, the method comprising:

forming the tunnel oxide film on the semiconductor substrate;

forming a first conductive layer to be used as a material of the floating gate on the tunnel oxide film;

patterning the first conductive layer in stripes extending in one direction;

the first conductive layer as a mask;

forming the first insulating film on the first conductive layer;

forming a second conductive layer on the first insulating film;

forming the control gate in stripes composed of the second conductive layer, the first insulating film in stripes and the floating gate in a rectangular solid composed of the first conductive layer by etching with a mask in stripes extending a direction perpendicular to the first conductive layer, after said forming of the source/drain region, removing a portion of the tunnel oxide film immediately under part of the floating gate by isotropical etching; and depositing a second insulating film on the control gate, sidewalls of the first insulating film, the floating gate and the tunnel oxide film to be covered with the second insulating film.

2. The method tar manufacturing a nonvolatile semiconductor memory according to claim 1, wherein the second insulating film is a silicon oxide film formed by chemical vapor deposition.

3. The method for manufacturing a nonvolatile semiconductor memory according to claim 1, wherein isotropic etching of the tunnel oxide film after formation of the floating gate is performed by wet etching using a fluorinated acid.

4. A method for manufacturing a nonvolatile semiconductor memory wherein memory cells formed in a matrix on a semiconductor substrate wherein each memory cell comprises a tunnel oxide film, a floating gate, a first insulating film and a control gate stacked in this order, the method comprising:

forming the tunnel oxide film on the semiconductor substrate;

forming a first conductive layer to be used as a material of the floating gate on the tunnel oxide film;

the first conductive layer as a mask;

forming the first insulating film on the first conductive layer;

forming a second conductive layer on the first insulating film;

forming the control gate in stripes of the second conductive layer, the first insulating film in stripes and the floating gate in a rectangular solid of the first conductive layer by etching with a mask in stripes extending a direction perpendicular to the first conductive layer;

removing a portion of the tunnel oxide film immediately below a sidewall of the floating gate by isotropical etching;

depositing a second insulating film on the control gate, sidewalls of the first insulating film, the floating gate and the tunnel oxide film to be covered with the second insulating film; and wherein after the second insulating film is deposited, thermal oxidation is performed to oxidize the sidewall of the floating gate via the second insulating film.

5. A method for manufacturing a nonvolatile semiconductor memory comprising at least one memory cell including a tunnel oxide film, a floating gate, a first insulating film and a control gate, the method comprising:

substrate;

forming a first conductive layer to be used as a material of the floating gate over the tunnel oxide film;

patterning the first conductive layer;

forming a source/drain region in a surface of the semiconductor substrate by using the first conductive layer as a mask;

forming the first insulating film over at least the first conductive layer;

forming a second conductive layer over at least the first insulating film, and patterning the second conductive layer to form at least one control gate;

after said forming of the source/drain region and after the floating gate has been formed via the first conductive layer, removing a portion of the tunnel oxide film immediately under part of the floating gate by etching; and depositing a second insulating film over at least the control gate, at least one sidewall of the first insulating film, at least one sidewall of the floating gate and at least one sidewall of the tunnel oxide film.

6. The method of claim 5, wherein after the second insulating film is deposited, thermal oxidation is performed to oxidize the sidewall of the floating gate via the second insulating film.

7. The method of claim 5, wherein said etching used to remove the portion of the tunnel oxide film comprises isotropic etching by wet etching using at least a fluorinated acid.

8. The method of claim 5, wherein the second insulating film comprises silicon oxide, and is formed via chemical vapor deposition.

* * * * *